United States Patent
Hoshino

(10) Patent No.: US 10,386,720 B2
(45) Date of Patent: *Aug. 20, 2019

(54) POLYMER AND POSITIVE RESIST COMPOSITION

(71) Applicant: ZEON CORPORATION, Chiyoda-ku, Tokyo (JP)

(72) Inventor: Manabu Hoshino, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/549,230

(22) PCT Filed: Feb. 15, 2016

(86) PCT No.: PCT/JP2016/000768
§ 371 (c)(1),
(2) Date: Aug. 7, 2017

(87) PCT Pub. No.: WO2016/132723
PCT Pub. Date: Aug. 25, 2016

(65) Prior Publication Data
US 2018/0011403 A1  Jan. 11, 2018

(30) Foreign Application Priority Data
Feb. 20, 2015  (JP) ................. 2015-031724

(51) Int. Cl.
*G03F 7/039* (2006.01)
*C08F 212/08* (2006.01)
*C08F 212/12* (2006.01)

(52) U.S. Cl.
CPC ............ *G03F 7/039* (2013.01); *C08F 212/08* (2013.01); *C08F 212/12* (2013.01)

(58) Field of Classification Search
CPC .............................. C08F 212/12; C08F 220/22
See application file for complete search history.

(56) References Cited

U.S. PATENT DOCUMENTS

| | | | | |
|---|---|---|---|---|
| 2018/0024431 A1* | 1/2018 | Hoshino | ............... | C08F 220/22 430/270.1 |
| 2018/0024432 A1* | 1/2018 | Hoshino | ............... | C08F 220/22 430/270.1 |

FOREIGN PATENT DOCUMENTS

| | | |
|---|---|---|
| JP | H083636 B2 | 1/1996 |
| JP | 2016012104 A | 1/2016 |

OTHER PUBLICATIONS

Apr. 26, 2016, International Search Report issued in the International Patent Application No. PCT/JP2016/000768.
Katsuya Okubo et al., "Cho Bisai Kako-yo Denshisen Polymer Resist no Kaihatsu to Hyoka", Polymer Material Forum Koen Yokoshu, 2012, 21, p. 38.
M. Otani et al., "Improvement of polymer type EB resist sensitivity and line edge roughness", Proceedings of SPIE, 2011, 8081, pp. 808107/1-808107/8.
T. Yamaguchi et al., "Influence of molecular weight of resist polymers on surface roughness and line-edge roughness", J. Vac. Sci. Technol. B, 2004, 22 (6), pp. 2604-2610.
T. Yamaguchi et al., "Molecular weight effect on line-edge roughness", Proceedings of SPIE, 2003, 5039, pp. 1212-1219.
Aug. 22, 2017, International Preliminary Report on Patentability issued in the International Patent Application No. PCT/JP2016/000768.

* cited by examiner

*Primary Examiner* — Cynthia Hamilton
(74) *Attorney, Agent, or Firm* — Kenja IP Law PC

(57) ABSTRACT

Provided are a polymer that can be favorably used as a positive resist having a high γ value and a positive resist composition that can favorably form a high-resolution pattern. The polymer includes an α-methylstyrene unit and a methyl α-chloroacrylate unit, and has a molecular weight distribution (Mw/Mn) of less than 1.48. The positive resist composition contains the aforementioned polymer and a solvent.

6 Claims, No Drawings

POLYMER AND POSITIVE RESIST COMPOSITION

TECHNICAL FIELD

The present disclosure relates to a polymer and a positive resist composition, and in particular relates to a polymer that is suitable for use as a positive resist and a positive resist composition that contains this polymer.

BACKGROUND

Polymers that display increased solubility in a developer after undergoing main chain scission through irradiation with ionizing radiation, such as an electron beam, or short-wavelength light, such as ultraviolet light, are conventionally used as main chain scission-type positive resists in fields such as semiconductor production. (Hereinafter, the term "ionizing radiation or the like" is used to refer collectively to ionizing radiation and short-wavelength light.)

PTL 1 discloses one example of a main chain scission-type positive resist having high sensitivity. The disclosed positive resist is formed from an α-methylstyrene-methyl α-chloroacrylate copolymer including an α-methylstyrene unit and a methyl α-chloroacrylate unit.

CITATION LIST

Patent Literature

PTL 1: JP H8-3636 B

SUMMARY

Technical Problem

In order to refine and increase the resolution of a pattern obtained using a main chain scission-type positive resist, there is demand for a resist that enables clear division, to as great an extent as possible, between regions that undergo main chain scission through irradiation with ionizing radiation or the like and then dissolve in a developer, and remaining regions that do not dissolve in the developer. In particular, from a viewpoint of achieving a higher resolution, it is preferable to use a resist having a characteristic of not dissolving in a developer before the irradiation dose of ionizing radiation or the like reaches a specific amount, and then rapidly undergoing main chain scission and dissolving in the developer once the irradiation dose reaches the specific amount. Accordingly, a resist having a characteristic such as described above is required to have a high γ value. The γ value expresses the magnitude of the gradient of a sensitivity curve indicating a relationship between the common logarithm of the irradiation dose of ionizing radiation or the like and the remaining film thickness of the resist after development.

However, the positive resist formed from the α-methylstyrene-methyl α-chloroacrylate copolymer described in PTL 1 does not have an adequately high γ value. Accordingly, there is room for improvement over the positive resist formed from the α-methylstyrene-methyl α-chloroacrylate copolymer described in PTL 1 in terms of further increasing the γ value.

One objective of the present disclosure is to provide a polymer that can be favorably used as a positive resist having a high γ value.

Another objective of this disclosure is to provide a positive resist composition that can favorably form a high-resolution pattern.

Solution to Problem

The inventor conducted diligent investigation to achieve the objectives set forth above. Through this investigation, the inventor discovered that an α-methylstyrene-methyl α-chloroacrylate copolymer having a specific molecular weight distribution can be favorably used as a positive resist having a high γ value. This discovery led to the present disclosure.

Specifically, the present disclosure aims to advantageously solve the problems set forth above by disclosing a polymer including an α-methylstyrene unit and a methyl α-chloroacrylate unit, wherein the polymer has a molecular weight distribution (Mw/Mn) of less than 1.48. An α-methylstyrene-methyl α-chloroacrylate copolymer having a molecular weight distribution (Mw/Mn) of less than 1.48 can be favorably used as a positive resist since the copolymer has a high γ value during use as a positive resist.

The "molecular weight distribution (Mw/Mn)" referred to herein is the ratio of the weight average molecular weight (Mw) relative to the number average molecular weight (Mn). The "number average molecular weight (Mn)" and "weight average molecular weight (Mw)" referred to herein can be measured by gel permeation chromatography.

In the presently disclosed polymer, a proportion of components having a molecular weight of less than 10,000 is preferably no greater than 0.8%. As a result of the proportion of components having a molecular weight of less than 10,000 being no greater than 0.8%, the γ value during use as a positive resist can be further increased.

The "proportion of components having a molecular weight of less than 10,000" referred to herein can be determined using a chromatogram obtained through gel permeation chromatography by calculating the total area (B) of peaks in the chromatogram for components having a molecular weight of less than 10,000 as a proportion (=(B/A)×100%) relative to the total area (A) of all peaks in the chromatogram.

In the presently disclosed polymer, a proportion of components having a molecular weight of less than 6,000 is preferably no greater than 0.2%. As a result of the proportion of components having a molecular weight of less than 6,000 being no greater than 0.2%, the γ value during use as a positive resist can be further increased.

The "proportion of components having a molecular weight of less than 6,000" referred to herein can be determined using a chromatogram obtained through gel permeation chromatography by calculating the total area (C) of peaks in the chromatogram for components having a molecular weight of less than 6,000 as a proportion (=(C/A)×100%) relative to the total area (A) of all peaks in the chromatogram.

Moreover, the present disclosure aims to advantageously solve the problems set forth above by disclosing a positive resist composition containing any one of the polymers described above and a solvent. As a result of the above-described polymer being contained as a positive resist, a high-resolution pattern can be favorably formed.

Advantageous Effect

Through the presently disclosed polymer, it is possible to provide a positive resist having a high γ value.

Moreover, through the presently disclosed positive resist composition, it is possible to favorably form a high-resolution pattern.

DETAILED DESCRIPTION

The following provides a detailed description of embodiments of the present disclosure.

The presently disclosed polymer can be favorably used as a main chain scission-type positive resist that undergoes main chain scission to lower molecular weight upon irradiation with ionizing radiation, such as an electron beam, or short-wavelength light, such as ultraviolet light. The presently disclosed positive resist composition contains the presently disclosed polymer as a positive resist.

(Polymer)

The presently disclosed polymer is an α-methylstyrene-methyl α-chloroacrylate copolymer that includes an α-methylstyrene unit and a methyl α-chloroacrylate unit, and that has a molecular weight distribution (Mw/Mn) of less than 1.48. As a result of the presently disclosed polymer including a structural unit derived from methyl α-chloroacrylate having a chloro group (—Cl) at the α-position (i.e., a methyl α-chloroacrylate unit), the presently disclosed polymer readily undergoes main chain scission to lower molecular weight upon irradiation with ionizing radiation or the like (for example, an electron beam, a KrF laser, an ArF laser, or an EUV laser). Moreover, as a result of the presently disclosed polymer having a molecular weight distribution (Mw/Mn) of less than 1.48, the presently disclosed polymer can be favorably used as a main chain scission-type positive resist since the presently disclosed polymer has a high γ value during use as a positive resist.

<α-Methylstyrene Unit>

The α-methylstyrene unit is a structural unit derived from α-methylstyrene. As a result of the presently disclosed polymer including the α-methylstyrene unit, the presently disclosed polymer displays excellent dry etching resistance during use as a positive resist due to the protective stability of the benzene ring in the α-methylstyrene unit.

The presently disclosed polymer preferably comprises at least 30 mol % and no greater than 70 mol % of α-methyl styrene units.

<Methyl α-Chloroacrylate Unit>

The methyl α-chloroacrylate unit is a structural unit derived from methyl α-chloroacrylate. As a result of the presently disclosed polymer including the methyl α-chloroacrylate unit, the presently disclosed polymer readily undergoes main chain scission through chlorine atom dissociation and β-cleavage reaction upon irradiation with ionizing radiation or the like. Accordingly, a positive resist formed from the presently disclosed polymer displays high sensitivity.

The presently disclosed polymer preferably comprises at least 30 mol % and no greater than 70 mol % of methyl α-chloroacrylate units.

<Molecular Weight Distribution>

The molecular weight distribution (Mw/Mn) of the presently disclosed polymer is required to be less than 1.48, and is preferably no greater than 1.47. If the molecular weight distribution (Mw/Mn) of the polymer is 1.48 or more, the γ value during use as a positive resist cannot be adequately increased. From a viewpoint of ease of polymer production, the molecular weight distribution (Mw/Mn) of the presently disclosed polymer is preferably at least 1.20, more preferably at least 1.24, and even more preferably at least 1.27.

[Weight Average Molecular Weight]

The weight average molecular weight (Mw) of the presently disclosed polymer is preferably at least 30,000, more preferably at least 33,000, even more preferably at least 35,000, and particularly preferably at least 36,000, and is preferably no greater than 100,000, and more preferably no greater than 70,000. When the weight average molecular weight (Mw) of the polymer is within any of the ranges set forth above, the polymer can be favorably used as a positive resist having excellent characteristics in terms of sensitivity, γ value, and so forth.

[Number Average Molecular Weight]

The number average molecular weight (Mn) of the presently disclosed polymer is preferably at least 25,000, and more preferably at least 28,000, and is preferably no greater than 100,000, and more preferably no greater than 50,000. When the number average molecular weight (Mn) of the polymer is within any of the ranges set forth above, the polymer can be favorably used as a positive resist having excellent characteristics in terms of sensitivity, γ value, and so forth.

<Proportion of Components Having Molecular Weight of Less than 10,000>

In the presently disclosed polymer, the proportion of components having a molecular weight of less than 10,000 is preferably no greater than 0.8%, and more preferably no greater than 0.6%. When the proportion of components having a molecular weight of less than 10,000 is no greater than 0.8%, the γ value during use as a positive resist can be further increased.

<Proportion of Components Having Molecular Weight of Less than 6,000>

In the presently disclosed polymer, the proportion of components having a molecular weight of less than 6,000 is preferably no greater than 0.2%, more preferably no greater than 0.15%, and even more preferably no greater than 0.10%. When the proportion of components having a molecular weight of less than 6,000 is no greater than 0.2%, the γ value during use as a positive resist can be further increased.

<Proportion of Components Having Molecular Weight of Greater than 80,000>

In the presently disclosed polymer, the proportion of components having a molecular weight of greater than 80,000 is preferably at least 1.5%, and more preferably at least 3.0%, and is preferably no greater than 40%. When the proportion of components having a molecular weight of greater than 80,000 is within any of the ranges set forth above, the polymer can be favorably used as a positive resist having excellent characteristics in terms of sensitivity, γ value, and so forth.

The "proportion of components having a molecular weight of greater than 80,000" referred to herein can be determined using a chromatogram obtained through gel permeation chromatography by calculating the total area (D) of peaks in the chromatogram for components having a molecular weight of greater than 80,000 as a proportion (=(D/A)×100%) relative to the total area (A) of all peaks in the chromatogram.

<Proportion of Components Having Molecular Weight of Greater than 100,000>

In the presently disclosed polymer, the proportion of components having a molecular weight of greater than 100,000 is preferably at least 0.5%, and more preferably at least 1.0%, and is preferably no greater than 30%, and more preferably no greater than 25%. When the proportion of components having a molecular weight of greater than 100,000 is within any of the ranges set forth above, the polymer can be favorably used as a positive resist having excellent characteristics in terms of sensitivity, γ value, and so forth.

The "proportion of components having a molecular weight of greater than 100,000" referred to herein can be determined using a chromatogram obtained through gel permeation chromatography by calculating the total area (E) of peaks in the chromatogram for components having a molecular weight of greater than 100,000 as a proportion (=(E/A)×100%) relative to the total area (A) of all peaks in the chromatogram.

(Production Method of Polymer)

The polymer having the properties set forth above can be produced by, for example, polymerizing a monomer composition containing α-methylstyrene and methyl α-chloroacrylate, and then purifying the resultant polymerized product.

The composition, molecular weight distribution, weight average molecular weight, and number average molecular weight of the polymer, and the proportions of components having various molecular weights in the polymer can be adjusted by altering the polymerization conditions and the purification conditions. In one specific example, the weight average molecular weight and the number average molecular weight can be reduced by raising the polymerization temperature. In another specific example, the weight average molecular weight and the number average molecular weight can be reduced by shortening the polymerization time.

<Polymerization of Monomer Composition>

The monomer composition used in production of the presently disclosed polymer may be a mixture containing monomers (inclusive of α-methylstyrene and methyl α-chloroacrylate), a solvent, a polymerization initiator, and optionally added additives. Polymerization of the monomer composition may be carried out by a known method. Cyclopentanone or the like is preferably used as the solvent and a radical polymerization initiator such as azobisisobutyronitrile is preferably used as the polymerization initiator.

The composition of the polymer can be adjusted by altering the percentage content of each monomer in the monomer composition used in polymerization. The proportion of high-molecular weight components contained in the polymer can be adjusted by altering the amount of the polymerization initiator. For example, the proportion of high-molecular weight components can be increased by reducing the amount of the polymerization initiator.

A polymerized product obtained through polymerization of the monomer composition may be collected by adding a good solvent such as tetrahydrofuran to a solution containing the polymerized product and subsequently dripping the solution to which the good solvent has been added into a poor solvent such as methanol to coagulate the polymerized product, and the polymerized product may then be purified as described below. However, the polymerized product is not specifically limited to being collected and purified in this manner.

<Purification of Polymerized Product>

The purification method used to purify the resultant polymerized product to obtain the polymer having the properties set forth above may be, but is not specifically limited to, a known purification method such as re-precipitation or column chromatography. Of these purification methods, purification by re-precipitation is preferable.

Also note that purification of the polymerized product may be repeated multiple times.

Purification of the polymerized product by re-precipitation is, for example, preferably carried out by dissolving the resultant polymerized product in a good solvent such as tetrahydrofuran, and subsequently dripping the resultant solution into a mixed solvent of a good solvent, such as tetrahydrofuran, and a poor solvent, such as methanol, to precipitate a portion of the polymerized product. When purification of the polymerized product is carried out by dripping a solution of the polymerized product into a mixed solvent of a good solvent and a poor solvent as described above, the molecular weight distribution, weight average molecular weight, and number average molecular weight of the resultant polymer and the proportion of low-molecular weight components in the resultant polymer can be easily adjusted by altering the types and/or mixing ratio of the good solvent and the poor solvent. In one specific example, the molecular weight of polymer that precipitates in the mixed solvent can be increased by increasing the proportion of the good solvent in the mixed solvent.

Also note that in a situation in which the polymerized product is purified by re-precipitation, polymer that precipitates in the mixed solvent of the good solvent and the poor solvent may be used as the presently disclosed polymer, or polymer that does not precipitate in the mixed solvent (i.e., polymer dissolved in the mixed solvent) may be used as the presently disclosed polymer, so long as the polymer that is used has the desired properties. Polymer that does not precipitate in the mixed solvent can be collected from the mixed solvent by a known technique such as concentration to dryness.

(Positive Resist Composition)

The presently disclosed positive resist composition contains the polymer described above and a solvent, and optionally further contains known additives that can be compounded in a resist composition. As a result of the presently disclosed positive resist composition containing the above-described polymer as a positive resist, a high-resolution pattern can be favorably formed using a resist film obtained through application and drying of the presently disclosed positive resist composition.

<Solvent>

The solvent may be any known solvent in which the above-described polymer is soluble. Of such solvents, anisole is preferable from a viewpoint of obtaining a positive resist composition of appropriate viscosity and improving application properties of the positive resist composition.

EXAMPLES

The following provides a more specific description of the present disclosure based on examples. However, the present disclosure is not limited to the following examples. In the following description, "%" and "parts" used in expressing quantities are by mass, unless otherwise specified.

In the examples and comparative examples, the following methods were used to measure and evaluate the weight average molecular weight, number average molecular weight, and molecular weight distribution of a polymer, the proportions of components having various molecular weights in the polymer, and the γ value of a positive resist formed from the polymer.

<Weight Average Molecular Weight, Number Average Molecular Weight, and Molecular Weight Distribution>

The weight average molecular weight (Mw) and number average molecular weight (Mn) of an obtained polymer were measured by gel permeation chromatography, and then the molecular weight distribution (Mw/Mn) of the polymer was calculated.

Specifically, the weight average molecular weight (Mw) and number average molecular weight (Mn) of the polymer were determined as values in terms of standard polystyrene using a gel permeation chromatograph (HLC-8220 produced by Tosoh Corporation) with tetrahydrofuran as a developing solvent. The molecular weight distribution (Mw/Mn) was then calculated.

<Proportions of Components Having Various Molecular Weights in Polymer>

A chromatogram of the polymer was obtained using a gel permeation chromatograph (HLC-8220 produced by Tosoh Corporation) with tetrahydrofuran as a developing solvent. The total area (A) of all peaks, the total area (B) of peaks for components having a molecular weight of less than 10,000, the total area (C) of peaks for components having a molecular weight of less than 6,000, the total area (D) of peaks for components having a molecular weight of greater than 80,000, and the total area (E) of peaks for components having a molecular weight of greater than 100,000 were determined from the obtained chromatogram. The proportions of components having various molecular weights were calculated using the following formulae.

Proportion of components having molecular weight of less than 10,000(%)=(B/A)×100

Proportion of components having molecular weight of less than 6,000(%)=(C/A)×100

Proportion of components having molecular weight of greater than 80,000(%)=(D/A)×100

Proportion of components having molecular weight of greater than 100,000(%)=(E/A)×100

<γ Value>

A spin coater (MS-A150 produced by Mikasa Co., Ltd.) was used to apply a positive resist composition onto a silicon wafer of 4 inches in diameter such as to have a thickness of 500 nm. The applied positive resist composition was heated for 3 minutes by a hot-plate at a temperature of 180° C. to form a resist film on the silicon wafer. An electron beam lithography device (ELS-5700 produced by Elionix Inc.) was used to draw a plurality of patterns (dimensions: 500 μm×500 μm) over the resist film with different electron beam irradiation doses. The electron beam irradiation dose was varied in a range of from 4 μC to 152 μC in increments of 4 μC. Development treatment was carried out for 1 minute at a temperature of 23° C. using amyl acetate (ZED-N50 produced by Zeon Corporation) as a resist developer and then rinsing was carried out for 10 seconds using isopropyl alcohol. Next, an optical film thickness meter (Lambda Ace produced by Dainippon Screen Mfg. Co., Ltd.) was used to measure the thickness of the resist film in regions in which drawing had been performed. A sensitivity curve was prepared that indicated a relationship between the common logarithm of the total electron beam irradiation dose and the film retention rate of the resist film after development (=thickness of resist film after development/thickness of resist film formed on silicon wafer). The γ value was determined with respect to the obtained sensitivity curve (horizontal axis: common logarithm of total electron beam irradiation dose, vertical axis: film retention rate of resist film (0≤film retention rate≤1.00)) by the following formula. In the following formula, $E_0$ is the logarithm of the total irradiation dose obtained when the sensitivity curve is fitted to a quadratic function in a range from a film retention rate of 0.20 to a film retention rate of 0.80, and then a film retention rate of 0 is substituted with respect to the obtained quadratic function (function of film retention rate and common logarithm of total irradiation dose). Also, $E_1$ is the logarithm of the total irradiation dose obtained when a straight line is prepared that joins points on the obtained quadratic function corresponding to film retention rates of 0 and 0.50 (linear approximation for gradient of sensitivity curve), and then a film retention rate of 1.00 is substituted with respect to the obtained straight line (function of film retention rate and common logarithm of total irradiation dose). The following formula expresses the gradient of the straight line between a film retention rate of 0 and a film retention rate of 1.00.

$$\gamma = \left| \log_{10}\left(\frac{E_1}{E_0}\right) \right|^{-1}$$

The γ value was evaluated in accordance with the following standard. A larger γ value indicates that the sensitivity curve has a larger gradient and that a high-resolution pattern can be more favorably formed.

A: γ Value of at least 9.5
B: γ Value of at least 8.5 and less than 9.5
C: γ Value of at least 7.5 and less than 8.5
D: γ Value of less than 7.5

Example 1

<Production of Polymer>
[Polymerization of Monomer Composition]

A monomer composition containing 3.0 g of methyl α-chloroacrylate and 6.88 g of α-methylstyrene as monomers, 2.47 g of cyclopentanone as a solvent, and 0.02182 g of azobisisobutyronitrile as a polymerization initiator was added into a glass container. The glass container was tightly sealed and purged with nitrogen, and was then stirred for 6.5 hours in a 78° C. thermostatic chamber under a nitrogen atmosphere. Thereafter, the glass container was returned to room temperature, the inside of the glass container was exposed to the atmosphere, and then 30 g of tetrahydrofuran (THF) was added to the resultant solution. The solution to which the THF had been added was then dripped into 300 g of methanol to precipitate a polymerized product. Thereafter, the solution containing the polymerized product that had been precipitated was filtered using a Kiriyama funnel to obtain a white coagulated material (polymerized product). The obtained polymerized product had a weight average molecular weight (Mw) of 35,000 and a molecular weight distribution (Mw/Mn) of 1.60. Moreover, the obtained polymerized product comprised 50 mol % of α-methylstyrene units and 50 mol % of methyl α-chloroacrylate units.

[Purification of Polymerized Product]

Next, the obtained polymerized product was dissolved in 100 g of THF and the resultant solution was then dripped into a mixed solvent comprising 600 g of THF and 400 g of methanol (MeOH) to precipitate a white coagulated material (polymer including α-methylstyrene units and methyl α-chloroacrylate units). Thereafter, the solution containing the polymer that had been precipitated was filtered using a Kiriyama funnel to obtain a white polymer. The weight average molecular weight, number average molecular weight, and molecular weight distribution of the obtained polymer, and the proportions of components having various molecular weights in the obtained polymer were measured. The results are shown in Table 1.

<Production of Positive Resist Composition>

The obtained polymer was dissolved in anisole used as a solvent to produce a resist solution (positive resist composition) in which the concentration of the polymer was 11 mass %. The γ value of a positive resist formed from the polymer was evaluated. The results are shown in Table 1.

Example 2

A polymerized product, a polymer, and a positive resist composition were produced in the same way as in Example 1 with the exception that a mixed solvent comprising 550 g of THF and 450 g of MeOH was used as the mixed solvent in purification of the polymerized product. Measurement and evaluation were carried out in the same way as in Example 1. The results are shown in Table 1.

Example 3

A polymerized product, a polymer, and a positive resist composition were produced in the same way as in Example 1 with the exception that the amount of azobisisobutyronitrile used as a polymerization initiator in polymerization of the monomer composition was changed to 0.03273 g and a mixed solvent comprising 550 g of THF and 450 g of MeOH was used as the mixed solvent in purification of the polymerized product. Measurement and evaluation were carried out in the same way as in Example 1. The results are shown in Table 1.

The pre-purification polymerized product had a weight average molecular weight (Mw) of 29,000 and a molecular weight distribution (Mw/Mn) of 1.56.

Example 4

A polymerized product, a polymer, and a positive resist composition were produced in the same way as in Example 1 with the exception that the amount of azobisisobutyronitrile used as a polymerization initiator in polymerization of the monomer composition was changed to 0.04364 g and a mixed solvent comprising 550 g of THF and 450 g of MeOH was used as the mixed solvent in purification of the polymerized product. Measurement and evaluation were carried out in the same way as in Example 1. The results are shown in Table 1.

The pre-purification polymerized product had a weight average molecular weight (Mw) of 24,000 and a molecular weight distribution (Mw/Mn) of 1.53.

Example 5

A polymerized product, a polymer, and a positive resist composition were produced in the same way as in Example 1 with the exception that the amount of azobisisobutyronitrile used as a polymerization initiator in polymerization of the monomer composition was changed to 0.01091 g. Measurement and evaluation were carried out in the same way as in Example 1. The results are shown in Table 1.

The pre-purification polymerized product had a weight average molecular weight (Mw) of 55,000 and a molecular weight distribution (Mw/Mn) of 1.85.

Example 6

<Production of Polymer>

[Polymerization of Monomer Composition]

A monomer composition was polymerized to obtain a polymerized product in the same way as in Example 1 with the exception that the amount of azobisisobutyronitrile used as a polymerization initiator was changed to 0.01091 g. The polymerized product had a weight average molecular weight (Mw) of 55,000 and a molecular weight distribution (Mw/Mn) of 1.85.

[Purification of Polymerized Product]

The obtained polymerized product was dissolved in 100 g of THF and the resultant solution was then dripped into a mixed solvent comprising 600 g of THF and 400 g of MeOH to precipitate a white coagulated material. Thereafter, the solution containing the coagulated material was filtered using a Kiriyama funnel to obtain the white coagulated material that had precipitated. The obtained coagulated material had a weight average molecular weight (Mw) of 65,000 and a molecular weight distribution (Mw/Mn) of 1.47.

Next, the obtained coagulated material was re-dissolved in 100 g of THF and the resultant solution was once again dripped into a mixed solvent comprising 650 g of THF and 350 g of MeOH to re-precipitate a white coagulated material. Thereafter, the solution containing the coagulated material that had been re-precipitated was filtered using a Kiriyama funnel, and the filtrate was collected. The filtrate was concentrated to dryness to obtain a white coagulated material (polymer including α-methylstyrene units and methyl α-chloroacrylate units). The weight average molecular weight, number average molecular weight, and molecular weight distribution of the obtained polymer, and the proportions of components having various molecular weights in the obtained polymer were measured in the same way as in Example 1. The results are shown in Table 1.

<Production of Positive Resist Composition>

A positive resist composition was produced in the same way as in Example 1 with the exception that the polymer produced as set forth above was used. Evaluation was carried out in the same way as in Example 1. The results are shown in Table 1.

Comparative Example 1

A polymerized product (polymer including α-methylstyrene units and methyl α-chloroacrylate units) and a positive resist composition were produced in the same way as in Example 1 with the exception that the amount of azobisisobutyronitrile used as a polymerization initiator in polymerization of the monomer composition was changed to 0.01091 g, and the positive resist composition was produced using, as a polymer, a polymerized product collected by filtration after polymerization of the monomer composition, without carrying out purification of the polymerized product. Measurement and evaluation were carried out in the same way as in Example 1. The results are shown in Table 1.

Comparative Example 2

<Production of Polymer>

[Polymerization of Monomer Composition]

A monomer composition was polymerized to obtain a polymerized product in the same way as in Example 1 with the exception that the amount of azobisisobutyronitrile used as a polymerization initiator was changed to 0.01091 g. The polymerized product had a weight average molecular weight (Mw) of 55,000 and a molecular weight distribution (Mw/Mn) of 1.85.

[Purification of Polymerized Product]

The obtained polymerized product was dissolved in 100 g of THF and the resultant solution was then dripped into a mixed solvent comprising 600 g of THF and 400 g of MeOH to precipitate a white coagulated material. Thereafter, the solution containing the coagulated material was filtered using a Kiriyama funnel, and the filtrate was collected. The filtrate was concentrated to dryness to obtain a white coagulated material (polymer including α-methylstyrene units and methyl α-chloroacrylate units). The weight average molecular weight, number average molecular weight, and molecular weight distribution of the obtained polymer, and the proportions of components having various molecular weights in the obtained polymer were measured in the same way as in Example 1. The results are shown in Table 1.

<Production of Positive Resist Composition>

A positive resist composition was produced in the same way as in Example 1 with the exception that the polymer produced as set forth above was used. Evaluation was carried out in the same way as in Example 1. The results are shown in Table 1.

parative Examples 1 and 2, which each had a molecular weight distribution (Mw/Mn) of at least 1.48.

INDUSTRIAL APPLICABILITY

Through the presently disclosed polymer, it is possible to provide a positive resist that has a high γ value.

Moreover, through the presently disclosed positive resist composition, it is possible to favorably form a high-resolution pattern.

The invention claimed is:

1. A polymer comprising an α-methylstyrene unit and a methyl α-chloroacrylate unit, wherein
    the polymer has a weight average molecular weight (Mw) of at least 64,000 and no greater than 70,000, and a molecular weight distribution (Mw/Mn) of less than 1.48; and
    a proportion of components having a molecular weight of greater than 100,000 is at least 11.53%.

2. The polymer according to claim 1, wherein
    a proportion of components having a molecular weight of less than 10,000 is no greater than 0.8%.

3. The polymer according to claim 1, wherein
    a proportion of components having a molecular weight of less than 6,000 is no greater than 0.2%.

4. A positive resist composition comprising the polymer according to claim 1 and a solvent.

5. A polymer comprising an α-methylstyrene unit and a methyl α-chloroacrylate unit, wherein:
    the polymer has a weight average molecular weight (Mw) of at least 36,000 and no greater than 41,000, and a molecular weight distribution (Mw/Mn) of less than 1.48; and

TABLE 1

|  |  | Example 1 | Example 2 | Example 3 | Example 4 | Example 5 | Example 6 | Comparative Example 1 | Comparative Example 2 |
|---|---|---|---|---|---|---|---|---|---|
| Polymer | Molecular weight distribution (Mw/Mn) [—] | 1.27 | 1.31 | 1.27 | 1.24 | 1.47 | 1.30 | 1.85 | 1.63 |
|  | Weight average molecular weight (Mw) [—] | $5.2 \times 10^4$ | $4.1 \times 10^4$ | $3.6 \times 10^4$ | $3.3 \times 10^4$ | $6.5 \times 10^4$ | $6.4 \times 10^4$ | $5.5 \times 10^4$ | $1.7 \times 10^4$ |
|  | Number average molecular weight (Mn) [—] | $4.1 \times 10^4$ | $3.1 \times 10^4$ | $2.8 \times 10^4$ | $2.6 \times 10^4$ | $4.4 \times 10^4$ | $4.9 \times 10^4$ | $2.9 \times 10^4$ | $1.1 \times 10^4$ |
|  | Proportion of components having molecular weight of less than 6,000 [%] | 0.21 | 0.00 | 0.05 | 0.37 | 0.00 | 0.10 | 1.60 | 13.41 |
|  | Proportion of components having molecular weight of less than 10,000 [%] | 0.32 | 0.21 | 0.52 | 0.87 | 0.00 | 0.29 | 4.60 | 34.54 |
|  | Proportion of components having molecular weight of greater than 80,000 [%] | 12.44 | 6.52 | 3.20 | 1.84 | 35.18 | 20.16 | 22.89 | 1.28 |
|  | Proportion of components having molecular weight of greater than 100,000 [%] | 6.05 | 3.00 | 1.23 | 0.68 | 24.25 | 11.53 | 15.67 | 0.82 |
| Evaluation | γ Value [—] | B | A | A | C | A | A | D | D |

It can be seen from Table 1 that in the case of positive resists formed from the polymers in Examples 1 to 6, which each had a molecular weight distribution (Mw/Mn) of less than 1.48, a high γ value was achieved compared to in the case of positive resists formed from the polymers in Coma proportion of components having a molecular weight of greater than 100,000 is at least 0.5%.

6. A positive resist composition comprising the polymer according to claim 5 and a solvent.

* * * * *